United States Patent
Bonhaus et al.

(10) Patent No.: US 6,836,188 B2
(45) Date of Patent: Dec. 28, 2004

(54) PLL CIRCUIT AND METHOD FOR ELIMINATING SELF-JITTER IN A SIGNAL WHICH IS RECEIVED BY A CONTROL CIRCUIT

(75) Inventors: Jorg Bonhaus, Hilden (DE); Thomas Duda, Duisburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/429,188

(22) Filed: May 2, 2003

(65) Prior Publication Data

US 2004/0012448 A1 Jan. 22, 2004

(30) Foreign Application Priority Data

May 3, 2002 (DE) .......................... 102 19 857

(51) Int. Cl.⁷ .................................................. H03L 7/00
(52) U.S. Cl. ............................ 331/16; 331/17; 327/156
(58) Field of Search ............................. 331/16, 17, 25; 327/156, 146, 553, 558; 359/152

(56) References Cited

U.S. PATENT DOCUMENTS

| | | | | |
|---|---|---|---|---|
| 5,053,724 A | * | 10/1991 | Ogino et al. | 331/14 |
| 5,168,245 A | * | 12/1992 | Koskowich | 331/1 A |
| 5,589,795 A | * | 12/1996 | Latva-Aho | 327/553 |
| 6,011,440 A | * | 1/2000 | Bell et al. | 330/297 |
| 2002/0021468 A1 | * | 2/2002 | Kato et al. | 359/152 |

* cited by examiner

*Primary Examiner*—Robert Pascal
*Assistant Examiner*—Joseph Chang
(74) *Attorney, Agent, or Firm*—Fish & Richardson P.C.

(57) ABSTRACT

PLL circuit for eliminating self-jitter in a signal which is received by a control circuit, having a phase comparison circuit for producing a phase difference signal, which indicates the phase difference between the received signal and a fed-back output signal from the PLL circuit; having a loop filter for filtering the phase difference signal which is produced; having an oscillator, which is controlled by the filtered phase difference signal, for producing the output signal from the PLL circuit; with the loop filter having a nonlinear transfer function.

21 Claims, 7 Drawing Sheets

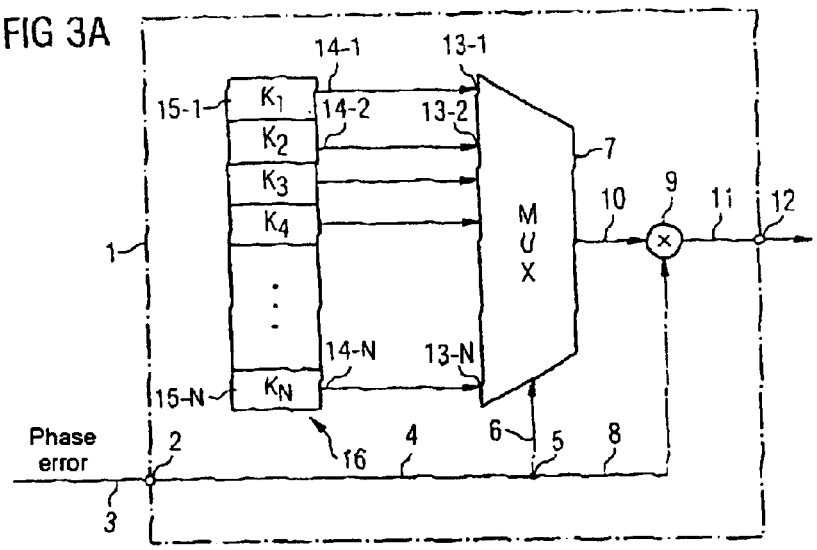
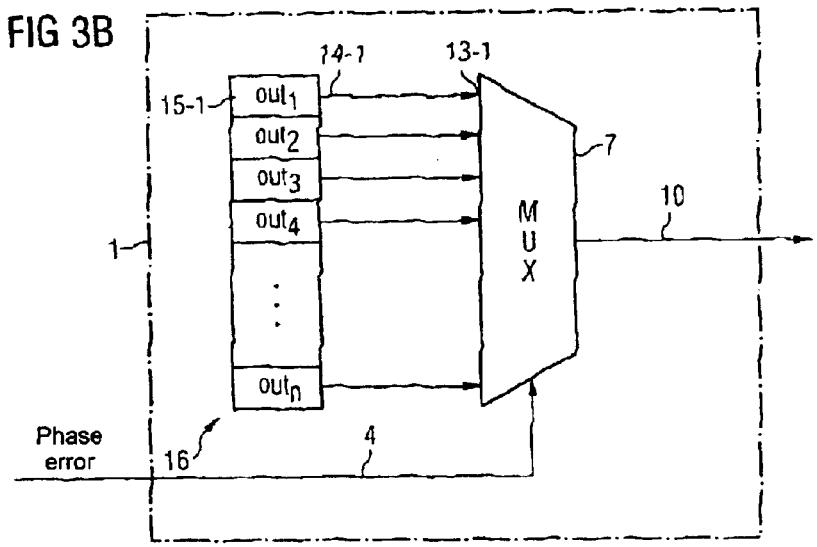

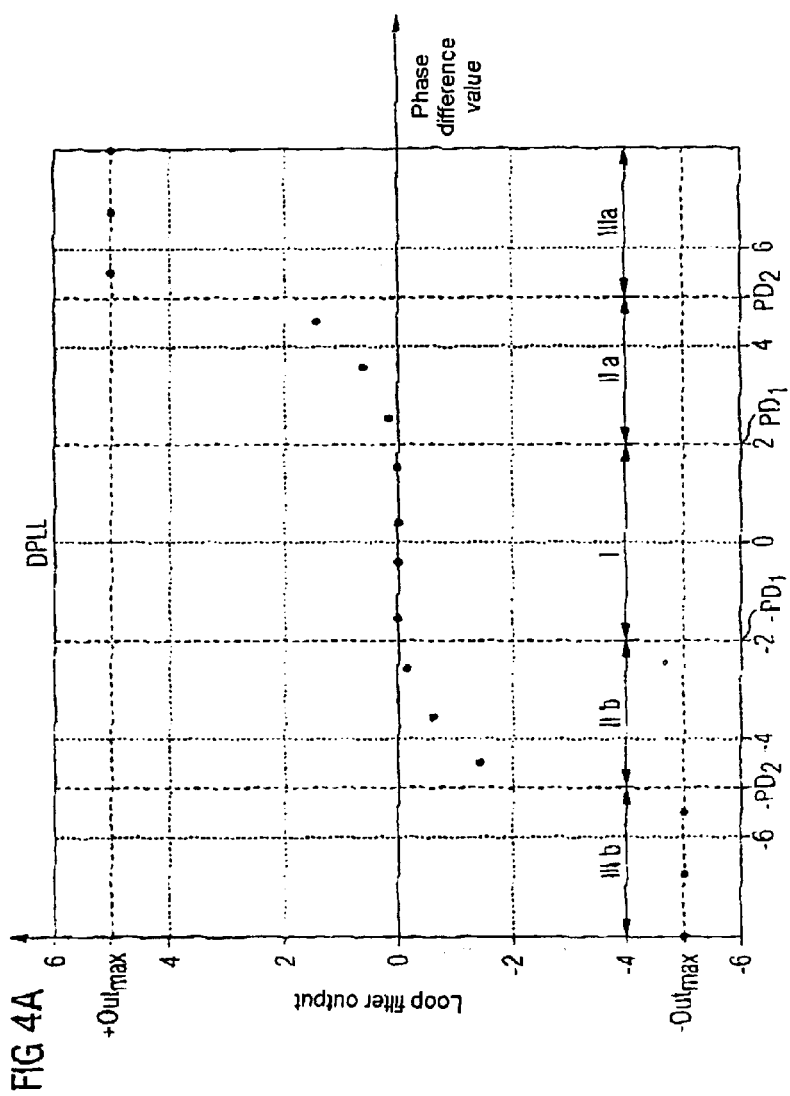

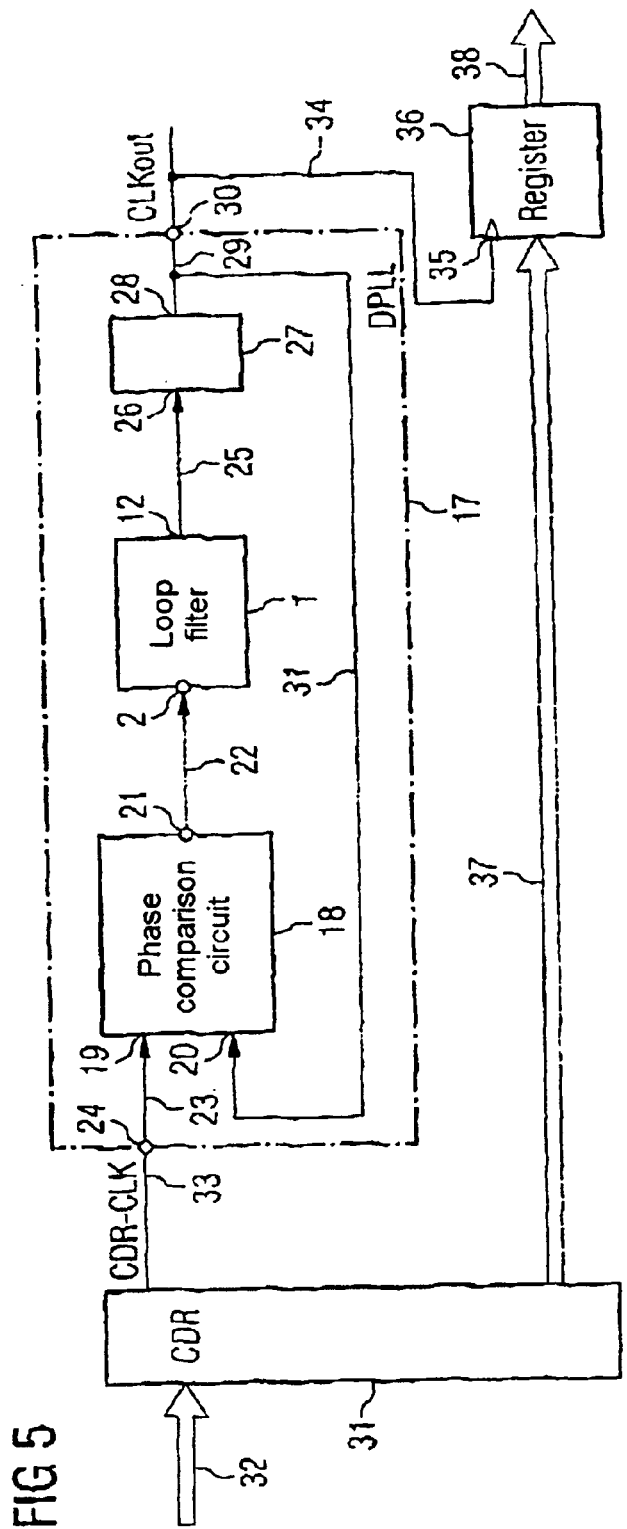

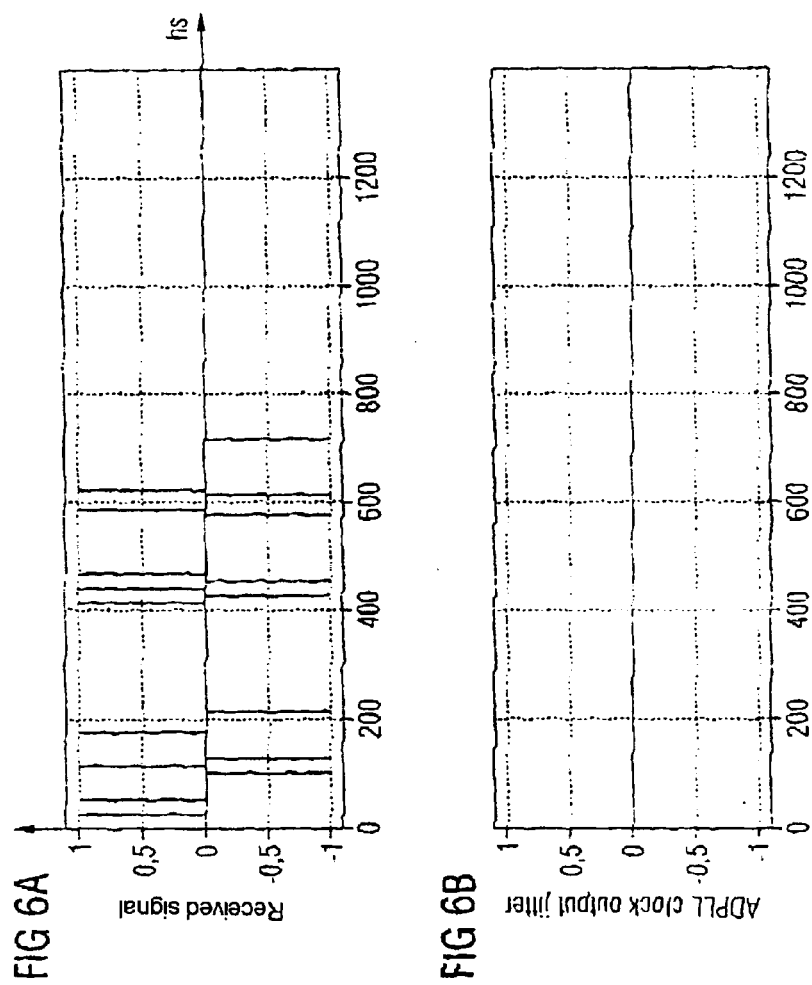

PLL CIRCUIT AND METHOD FOR ELIMINATING SELF-JITTER IN A SIGNAL WHICH IS RECEIVED BY A CONTROL CIRCUIT

RELATED APPLICATION

Under 35 USC §119, this application claims the benefit of a foreign priority application filed in Germany, serial number 102 19 857.8, filed May 3, 2002.

FIELD OF THE INVENTION

The invention relates to a PLL circuit for eliminating self-jitter in a signal which is received by a control circuit, in particular the self-jitter in a signal which is emitted by a clock and data recovery circuit (CDR) within a receiver.

BACKGROUND OF THE INVENTION

FIG. 1 shows an ADPLL circuit (ADPLL: All Digital Phase Locked Loop) according to the prior art. PLL circuits may be either analog or digital. PLL circuits are phase locked loops and are used for synchronizing the frequency and phase of two oscillations. In this case, PLL circuits essentially comprise a phase comparison circuit for producing a phase difference signal and which determines the phase difference between a received signal and a fed-back output signal from the PLL circuit, a downstream loop filter for filtering the phase difference signal that is produced, and an oscillator which is controlled by the filtered phase difference and generates the output signal from the PLL circuit.

FIG. 2a shows a digital loop filter according to the prior art (P-regulator), which is used within a conventional ADPLL circuit, as is illustrated in FIG. 1. FIG. 2b shows the associated transmission characteristic of the conventional digital loop filter (P-regulator) as illustrated in FIG. 2a.

PLL circuits are circuits in which a frequency is synchronized by means of a reference frequency until the output signal and the reference signal match in frequency and phase. The received signal is generally a reference clock signal. If the reference clock signal is obtained by means of a clock and data recovery circuit CDR (Clock Data Recovery) within a receiver, the received signal is subject to jitter which is formed from the self-jitter of the clock and data recovery circuit CDR and from data jitter.

A conventional PLL circuit having the loop jitter illustrated in FIG. 2 is used for stabilizing the applied reference clock signal. A conventional PLL circuit, as is illustrated in FIG. 1, acts like a low-pass filter in which high-frequency signal components are filtered out and low-frequency signal components of the applied reference clock signal are passed on. In consequence, the PLL circuit suppresses high-frequency signal interference, but the reference clock signal may diverge slowly if the frequency of the reference clock signal changes.

The conventional PLL circuit according to the prior art, as is illustrated in FIG. 1, contains a linear P-regulator and a linear loop filter, as is shown in FIG. 2a. The linear transfer function of the digital loop filter, as is shown in FIG. 2b, means that the signal components of the self-jitter of the received signal are amplified in accordance with the gain factor k setting, as is illustrated in FIG. 6a. The self-jitter which is produced by the clock and data recovery circuit CDR is amplified in accordance with the gain factor k setting of the digital loop filter. The higher the gain factor k setting, the higher is the gain of the self-jitter signal component as well. If the gain factor k of the linear P-regulator, as is illustrated in FIG. 2a, is set to be small, although this reduces the gain of the self-jitter in the same way, the ADPLL circuit will no longer be able to follow the reference clock signal that is emitted by the clock and data recovery circuit CDR if the gain factor k setting is too low. In this case, the frequency of the clock signal which is stabilized by the PLL circuit drifts away from the frequency of the received data signal, and data losses can occur when transferring the received data to a data register which is clocked by the stabilized clock signal.

SUMMARY OF THE INVENTION

The object of the present invention is therefore to provide a PLL circuit which is able to completely eliminate the self-jitter in a signal which is received by a control circuit, and which can follow a frequency change in the received signal.

The invention provides a PLL circuit for eliminating self-jitter in a signal which is received by a control circuit, having a phase comparison circuit for producing a phase difference signal, which indicates the phase difference between the received signal and a fed-back output signal from the PLL circuit, a loop filter for filtering the phase difference signal which is produced, an oscillator, which is controlled by the filtered phase difference signal, for producing the output signal from the PLL circuit, with the loop filter having a nonlinear transfer function.

In one preferred embodiment of the PLL circuit, the transfer function is point-symmetrical about the zero point.

This offers the advantage that the self-jitter, which likewise occurs symmetrically with respect to the zero point, is eliminated completely in both phase difference amplitude directions.

In one particularly preferred embodiment of the PLL circuit according to the invention, the nonlinear transfer function of the loop filter has three transmission ranges with the loop filter in a first transmission range having a signal gain of zero for a small phase difference up to a first threshold value, with the loop filter having a nonlinear signal gain in a second transmission range for a medium phase difference between the first threshold value and a second threshold value, and with the loop filter having a constant maximum signal amplitude in a third transmission range for a large phase difference, which is greater than the second threshold value.

The loop filter is preferably digital.

In one particularly preferred embodiment of the PLL circuit according to the invention, the digital loop filter comprises a coefficient memory for storing signal gain coefficients and has a multiplexer which is controlled by the phase difference signal and passes on the stored signal gain coefficients to a multiplier, which multiplies the phase difference signal by the signal gain coefficient that is passed on.

The coefficient memory for the digital loop filter according to the invention is preferably programmable.

In an alternative embodiment of the PLL circuit according to the invention, the loop filter is analog.

The control circuit is preferably a circuit for clock and data recovery within a receiver, with the recovered clock signal being applied to the phase comparison circuit.

The invention furthermore provides a method for eliminating self-jitter in a signal which is received by a control circuit, having the following steps, namely: calculation of the phase difference between the phase of the signal which is received by the control circuit and a nominal phase, amplification of the signal which is received by the control circuit, with the received signal being amplified in a nonlinear manner as a function of the calculated phase difference.

In one preferred embodiment of the method according to the invention for eliminating self-jitter in a signal which is received by a control circuit, the calculated phase difference is compared with programmable phase difference threshold values, with the signal which is received by the control circuit being amplified with a signal gain factor of zero in a first transmission range for a small phase difference up to a first phase difference threshold value, with the signal which is received by the control circuit being amplified in a nonlinear manner by programmable signal gain factors as a function of the calculated phase difference in a second transmission range for a medium phase difference between the first phase difference threshold value and a second phase difference threshold value, and with the signal which is received by the control circuit being output with a constant maximum signal amplitude in a third transmission range for a large phase difference which is greater than the phase difference second threshold value.

The method according to the invention is preferably carried out by means of a signal processor.

The signal processor is preferably a digital signal processor DSP.

Preferred embodiments of the PLL circuit according to the invention and of the method according to the invention for eliminating self-jitter in a signal which is received by a control circuit will be described in the following text with reference to the attached figures, in order to explain features which are significant to the invention.

BRIEF DESCRIPTION OF THE FIGURES

FIG. 3a shows one preferred embodiment of a loop filter according to the invention;

FIG. 3b shows a further preferred embodiment of the loop filter according to the invention;

FIG. 4a shows a transfer function of the loop filter according to the invention, as shown in FIG. 3;

FIG. 5 shows a receiving circuit which uses the PLL circuit according to the invention for reference clock stabilization;

FIG. 6a shows the self-jitter of the reference clock signal which is emitted by the clock and data recovery circuit CDR;

FIG. 6b shows the regulated self-jitter in the stabilized output clock signal as shown in FIG. 6a, which is emitted by the PLL circuit according to the invention.

DETAILED DESCRIPTION OF THE FIGURES

Figure 1:
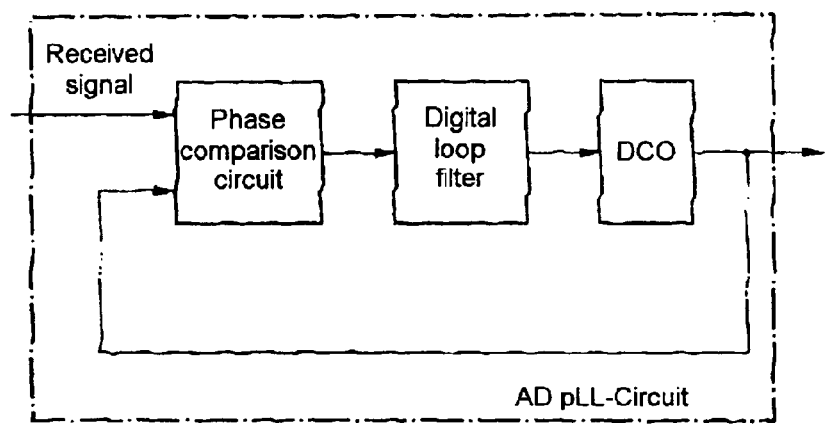
FIG. 1 shows a PLL circuit according to the prior art.
Figure 2A:
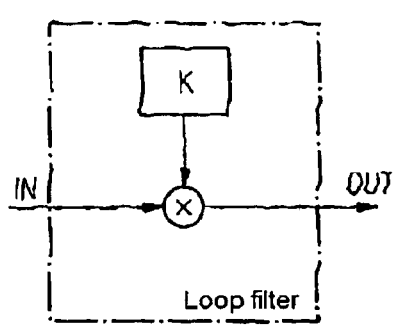
FIG. 2a shows a loop filter according to the prior art.
Figure 2B:
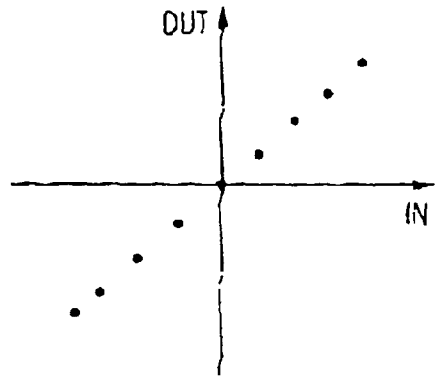
FIG. 2b shows a transfer function of the conventional loop filter according to the prior art.

FIG. 3a shows a first embodiment of a loop filter with a nonlinear transfer function for the PLL circuit according to the invention for eliminating the self-jitter in a received signal. The loop filter 1 which is illustrated in FIG. 3 is digital. In an alternative embodiment, the loop filter is analog.

The digital loop filter 1 which is illustrated in FIG. 3a is a nonlinear P-regulator, which is used in the PLL circuit according to the invention. The digital loop filter 1 has a signal input 2 for receiving a digital data discrepancy signal via a signal line 3. The phase difference signal which is applied to the signal input 2 is passed via an internal line 4 to a branching node 5 and, via an internal control line 6, controls a multiplexer 7 that is contained in the loop filter 1. The branching node 5 is furthermore connected via an internal line 8 to a multiplier 9. The output of the multiplexer 7 is likewise connected via a line 10 to the multiplier 9. The multiplier 9 multiplies the output value from the multiplexer 7 by the phase difference value or phase difference signal, and emits the weighted phase difference signal via a line 11 to a signal output 12 from the digital loop filter 1.

The multiplexer 7 has a large number of signal inputs 13, which are connected via lines 14 to coefficient storage locations 15 within a register 16. The signal gain coefficients $K_I$ of the register 16 are variable or programmable in one embodiment of the PLL circuit according to the invention.

The multiplexer 7 is controlled via the control line 6 by the phase difference signal which is applied to the input 2 of the digital loop filter 2, and passes on one input 13-i to the output line 10 for multiplication by the phase difference signal, as a function of the applied phase difference value.

FIG. 3b shows a simplified embodiment of the digital loop filter 1 according to the invention. In this embodiment, the output values of the transfer function are stored directly in the memory 16. The advantage of this embodiment is that no multipliers are required.

FIG. 4a shows the transfer function for one exemplary embodiment of the digital loop filter 1 according to the invention, as is illustrated in FIGS. 3a, 3b. The phase difference value which is applied to the signal input 2 of the digital loop filter 1 is multiplied in accordance with the nonlinear transfer function setting, and is emitted as a weighted phase difference value at the output 12 of the loop filter 1. As can be seen from FIG. 4a, the transfer function is point-symmetrical about the phase difference value zero.

In a first transmission range I of the loop filter 1, the phase difference value is small and the stored signal gain coefficients for this transmission range are zero up to a first phase difference threshold value PD1. If the phase difference value which is applied to the signal input 2 of the loop filter 1 is in the first transmission range I, that is to say between the negative first phase difference threshold value −PD1 and the positive threshold value +PD1, the multiplexer 7 passes on the signal gain coefficient $K_i$ to the output 10 as a function of the phase difference value, this being the signal gain coefficient $K_i$ which is stored in the register 16 and has the value zero.

If the phase difference value is in a second transmission range II, that is to say between the first phase difference threshold value PD1 and a second phase difference threshold value PD2, the applied phase difference value is amplified nonlinearly. In a further embodiment, the phase difference is amplified linearly in the range II.

If the applied phase difference value is in a third transmission range III, that is to say the phase difference is greater than the second threshold value PD2, the second phase difference value is limited to a maximum value $out_{max}$.

Figure 4B:
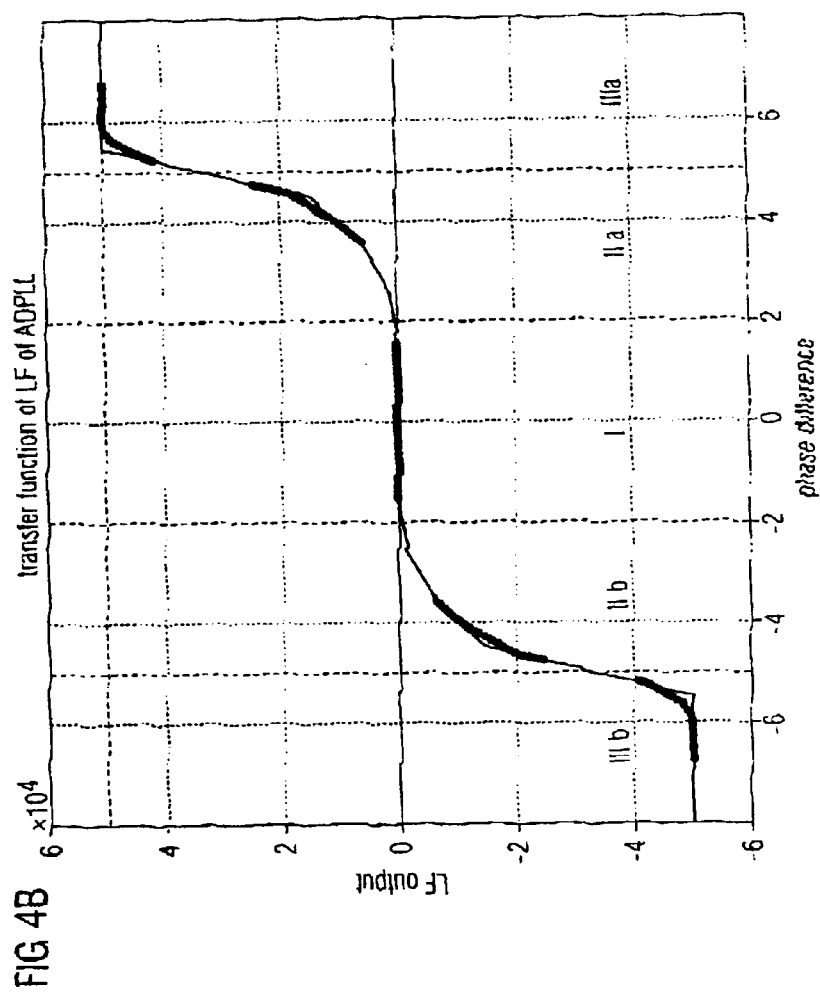
FIG. 4b shows a further transfer function of an analog loop filter according to the invention.

In an alternative embodiment, the loop filter 1 may be analog. FIG. 4b shows a transfer function of a loop filter 1 which is formed from analog components.

The self-jitter on the signal which is emitted by the clock and data recovery circuit CDR has small amplitudes. In the transmission range I, the input jitter is completely removed or eliminated by the digital loop filter 1 according to the invention, because the signal gain factor is zero. In the range II, that is to say between the first phase difference threshold value PD1 and the second phase difference threshold value PD2, the applied phase difference signal is not amplified linearly in accordance with the coefficient settings. If the applied phase difference value is above the second threshold value or maximum value PD2, the phase difference value or the phase difference signal is multiplied or amplified by a maximum signal gain factor $k_{max}$ to form a maximum output signal $out_{max}$. In consequence, the PLL circuit is able to follow the signal with amplitudes beyond this maximum value, without any constraint.

FIG. 5 shows an application example for the PLL circuit according to the invention for eliminating self-jitter. The PLL circuit 17 according to the invention contains the loop filter 1 illustrated in FIG. 3. The PLL circuit 17 also contains a phase comparison circuit 18 with a first signal input 19 and a second signal input 20. The phase comparison circuit 18 has a signal output 21, which is connected via a line 22 to the input 2 of the digital loop filter 1. The phase comparison circuit 18 is connected via its signal input 19 and an internal line 23 to an input 24 of the PLL circuit 17.

The output 12 of the loop filter 1 is connected via a line 25 to an input 26 of a controlled oscillator 27. If the PLL circuit 17 according to the invention is digital, the controlled oscillator 27 is a digitally controlled oscillator DCO. If the PLL circuit 17 according to the invention is analog, one preferred embodiment of the oscillator 27 is a voltage-controlled oscillator VCO. The controlled oscillator 27 has a signal output 28, which is connected via a line 29 to an output 30 of the PLL circuit 17. Furthermore, the output 28 of the oscillator 27 is connected via a feedback line 31 to the second signal input 20 of the phase comparison circuit 18.

In the exemplary embodiment illustrated in FIG. 5, a clock and data recovery circuit 31 within a receiver receives data via data lines 32. The clock and data recovery circuit uses the received data to obtain the reception clock for the data signal, and emits the clock signal CDR-CLK that is obtained via a clock line 33 to the signal input 24 of the PLL circuit 17. The received clock signal CDR-CLK is used as a reference clock signal for the PLL circuit 17, and is passed via the internal line 23 to the first signal input 19 of the phase comparison circuit 18. The phase comparison circuit 18 compares the phase of the applied reference clock signal with the phase of the output signal, which is fed back via the line 31, from the controlled oscillator 27 and forms a phase difference signal, which is applied via the line 22 to the signal input 2 of the loop filter 1. The loop filter 1 filters the phase difference signal by amplifying the signal using a transfer function as illustrated in FIG. 4. The signal gain of the applied phase difference signal or phase difference value is in this case nonlinear, and the signal amplification is preferably carried out using a transfer function which is point-symmetrical about the zero value of the phase difference signal. The PLL circuit 17 according to the invention completely suppresses the self-jitter that is produced by the CDR circuit 31, by virtue of the transmission range I. The PLL circuit 17 is, however, able to follow a slow frequency change in the reference clock signal CDR-CLK without any constraint. If the data transmission rate of the data signal which is applied to the CDR circuit 31 changes, the clock frequency of the stabilized clock signal which is produced by the PLL circuit 17 follows this data frequency change.

In the example shown in FIG. 5, the signal output of the PLL circuit 17 is connected via a clock line 34 to a clock signal input 35 of a data register 36. On the input side, the data register 36 is connected to data lines 37 from the clock and data recovery circuit 31, and receives the recovered data. The data register 36 is clocked by means of the stabilized clock signal $CLK_{out}$, which has had the self-jitter from the CDR circuit 31 removed from it, so that the data which is emitted from the data register 36 via data lines 38 has likewise had the self-jitter from the CDR circuit 31 removed from it. If the data transmission rate of the data which is received by the CDR circuit 31, and hence the frequency of the reference clock signal CDR-CLK which has been generated, change, the PLL circuit 17 follows this frequency change and clocks the data register 36 at the changed clock frequency. This ensures that the data reception frequency of the data which is received by the CDR circuit 17, and that the clock rate of the stabilized clock signal $CLK_{out}$ which is emitted from the PLL circuit 17 do not differ from one another, so that no data losses can occur.

FIG. 6a shows the self-jitter on the recovered reference clock signal CDR-CLK, which is emitted by the CDR circuit 31, at the signal input 24 of the PLL circuit 17.

FIG. 6b shows the regulated self-jitter on the stabilized clock signal $CLK_{out}$, which is emitted from the PLL circuit 17, at the signal output 30 of the PLL circuit 17 with an input signal (in this case the self-jitter CDR) as shown in FIG. 6a. As can be seen from FIG. 6b, the intrinsic jitter or the self-jitter of the CDR circuit 31 is removed completely by the PLL circuit 17 according to the invention. The intrinsic jitter is removed about the zero point with the aid of a nonlinear P-regulator 1 or of the nonlinear loop filter 1.

Figure 7:
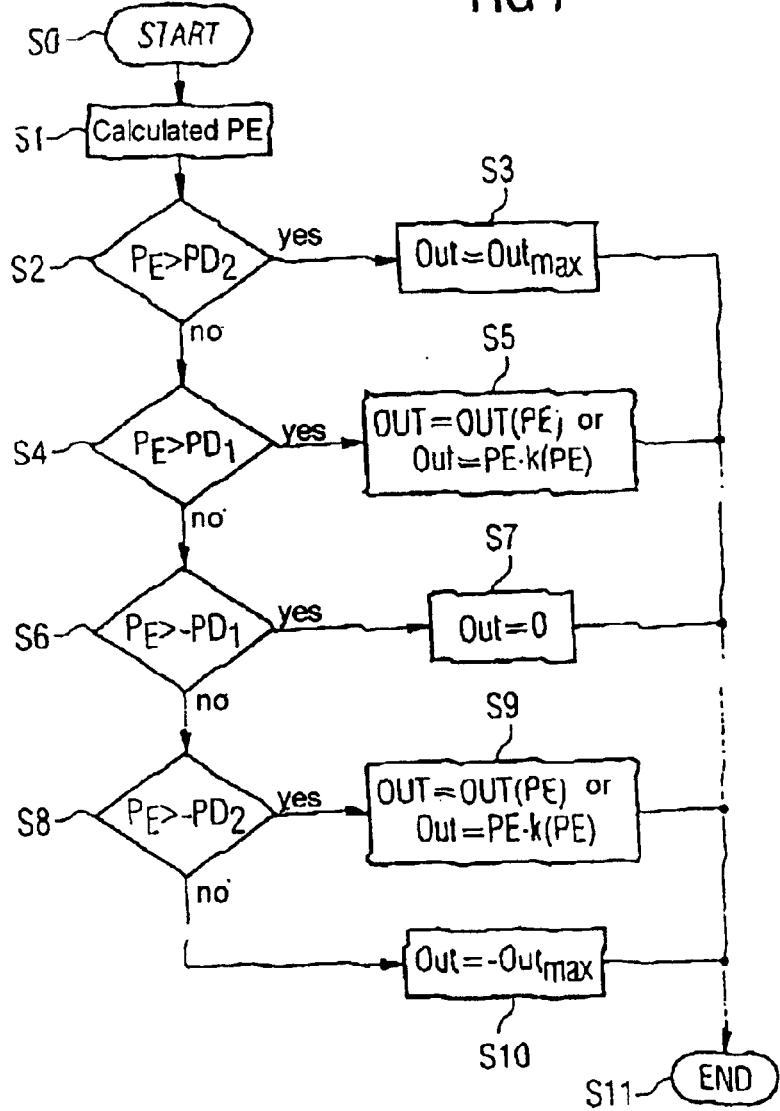
FIG. 7 shows a flowchart of one preferred embodiment of the method according to the invention for eliminating self-jitter in a received signal.

FIG. 7 shows a flowchart of a particularly preferred embodiment of the method according to the invention for eliminating the self-jitter of a signal which is emitted by the control circuit 31.

In the method according to the invention, the phase difference between the phase of the signal which is received by the control circuit and a nominal phase is determined first of all, and the signal which is received by the control circuit is then amplified in a nonlinear manner as a function of the determined phase difference value. In this case, the calculated phase difference is preferably compared with programmable phase difference threshold values.

After a starting step $S_0$, the phase difference or the phase difference value between the phase of the received reference clock signal and a nominal phase are calculated in a first step $S_1$.

The calculated phase difference value (phase error) $P_E$ is compared with a maximum threshold value $P_{D2}$ in a step $S_2$. If the phase error $P_E$ is greater than the maximum second threshold value PD2, the applied phase difference signal or the phase difference value PE is amplified by a maximum signal gain factor $k_{max}$ in a step $S_3$, and is output as the maximum output signal $Out_{max}$, with the procedure ending in step $S_{11}$.

If the phase error or the phase difference PE as calculated in the step $S_1$ is less than the second maximum second phase difference threshold value $PD_2$, the phase difference is compared in a step $S_4$ with a second, lower threshold value $PD_1$. If it is found that the determined phase difference PE is greater than the first, lower threshold value $PD_1$, the phase difference PE is emitted, multiplied in a nonlinear manner by the programmed signal gain factors $k_i$ in a step $S_5$, and the procedure is ended in step $S_{11}$.

If it is found in the step $S_4$ that the calculated phase difference value PE is also below the first, lower threshold value $PD_1$, the phase difference PE is compared with the negative first threshold value $-PD_1$ in a step $S_6$. If the phase difference value PE is greater than the negative first threshold value $PD_1$, the phase difference is in the transmission range I of the transfer function illustrated in FIG. 4, and the phase difference value is multiplied by a signal gain factor of zero in a step $S_7$, and the procedure is ended in step $S_{11}$. This eliminates the self-jitter, with its small amplitudes.

If it is found in step $S_6$ that the phase difference is less than the negative first threshold value $PD_1$, a check is carried out in a step $S_8$ to determine whether the calculated phase difference value PE is greater than or less than the negative second maximum threshold value $PD_2$. If the phase difference $P_E$ is greater than the negative second threshold value $-PD_2$, the phase difference value is in the transmission range $II_B$, and the phase difference PE is multiplied in accordance with a nonlinear transfer function by a signal gain factor $K_i$ in a step S9, and the procedure is ended in step $S_{11}$.

If the calculated phase difference PE is less than the negative second phase difference value $-PD_2$, and the phase difference value is thus in the transfer function range $III_B$, the phase difference value is multiplied in a step $S_{10}$ by a maximum gain factor $k_{max}$ to form the maximum possible negative output signal value $-Out_{max}$, is output, and the procedure is ended in step $S_{11}$.

The method according to the invention is preferably implemented in a signal processor. The signal processor is preferably a digital signal processor DSP.

The method according to the invention, as it is illustrated in FIG. 7, can also be used with more complex filters. If the mid-frequency of the input signal which is applied to the PLL circuit is not identical to the mid-frequency of the PLL, then a PI-regulator is used as the loop regulator. In this case, the P-regulator is formed within the PI-regulator by the digital loop filter 1 according to the invention. The I-regulator is connected in parallel with the P-regulator.

The elimination of the self-jitter by means of the PLL circuit 17 according to the invention results in compliance with the jitter standard "E1ETS300011/ITU-TI.431 Multiple Access" and the jitter standard "T1G824/ITU-TI.431". In addition to complying with the jitter standards, the P-regulator according to the invention and the loop filter 1 according to the invention offer the advantage that they reduce the power consumption and the crosstalk up to a maximum value.

List of Reference Symbols
1 Digital loop filter
2 Input
3 Line
4 Line
5 Branch point
6 Control line
7 Multiplexer
8 Line
9 Multiplier
10 Line
11 Line
12 Output
13 Multiplexer input
14 Line
15 Coefficient storage location
16 Memory
17 PLL circuit
18 Phase comparison circuit
19 Input
20 Input
21 Output
22 Line
23 Line
24 PLL circuit input
25 Line
26 Input
27 Controlled oscillator
28 Output
29 Line
30 PLL circuit output
31 Circuit for clock and data recovery
32 Data lines
33 Clock line
34 Clock line
35 Clock input
36 Data register
37 Data lines
38 Data lines

What is claimed is:

1. A PLL circuit for eliminating self-jitter in a signal received by a control circuit, having:

a phase comparison circuit for producing a phase difference signal that indicates the phase difference between the received signal and a fed-back output signal from the PLL circuit;

a loop filter for filtering the phase difference signal produced by the phase comparison circuit;

an oscillator, which is controlled by the filtered phase difference signal, for producing the output signal from the PLL circuit;

wherein the loop filter has a nonlinear transfer function that has three transmission ranges (I, II, III), with the loop filter in a first transmission range (I) having a signal gain of zero for a small phase difference up to a first threshold value ($PD_1$), with the loop filter having a nonlinear signal gain in a second transmission range (II) for a medium phase difference between the first threshold value ($PD_1$) and a second threshold value ($PD_2$), and with the loop filter having a constant maximum signal amplitude in a third transmission range (III) for a large phase difference, which is greater than the second threshold value ($PD_2$).

2. The PLL circuit as claimed in claim 1, wherein the transfer function is point-symmetrical.

3. The PLL circuit as claimed in claim 2, wherein the nonlinear transfer function of the loop filter has three transmission ranges (I, II, III), with the loop filter in a first transmission range (I) having a signal gain of zero for a small phase difference up to a first threshold value ($PD_1$), with the loop filter having a nonlinear signal gain in a second transmission range (II) for a medium phase difference between the first threshold value ($PD_1$) and a second threshold value ($PD_2$), and with the loop filter having a constant maximum signal amplitude in a third transmission range (III) for a large phase difference, which is greater than the second threshold value ($PD_2$).

4. The PLL circuit as claimed in claim 2, wherein the PLL circuit is analog.

5. The PLL circuit as claimed in claim 1, wherein the loop filter is digital.

6. The PLL circuit as claimed in claim 5, wherein the digital loop filter has a memory for storing signal gain coefficients ($K_i$) and has a multiplexer which is controlled by the phase difference signal and passes on the stored signal gain coefficients, as a function of the phase difference signal, to a multiplier, which multiplies the phase difference signal by the signal gain coefficients ($K_i$) that are passed on.

7. The PLL circuit as claimed in claim 6, wherein the memory is programmable.

8. The PLL circuit as claimed in claim 5, wherein the digital loop filter has a memory for storing output values (out$_i$) from the digital loop filter and has a multiplexer that is controlled by the phase difference signal and passes on the stored output values as a function of the phase difference signal.

9. The PLL circuit as claimed in claim 8, wherein the memory is programmable.

10. The PLL circuit as claimed in claim 1, wherein the PLL circuit is analog.

11. The PLL circuit as claimed in claim 1, wherein the control circuit is a circuit for clock and data recovery CDR within a receiver, with the recovered clock signal being applied to the phase comparison circuit.

12. The PLL circuit as claimed in claim 1, wherein the PLL circuit is analog.

13. A method for eliminating self-jitter in a signal which is received by a control circuit, having the following steps:
    calculation of the phase difference between the phase of the signal (CDR-CLK) which is received by the control circuit and a nominal phase; and
    amplification of the signal which is received by the control circuit, with the received signal being amplified in a nonlinear manner as a function of the calculated phase difference.

14. The method as claimed in claim 13, wherein the calculated phase difference (PE) is compared with programmable phase difference threshold values, with the signal that is received by the control circuit being amplified with a signal gain factor of zero in a first transmission range (I) for a small phase difference up to a first phase difference threshold value (PD$_1$), with the signal that is received by the control circuit being amplified in a nonlinear manner by programmable signal gain factors as a function of the calculated phase difference (PE) in a second transmission range (II) for a medium phase difference between the first threshold value (PD$_1$) and a second threshold value (PD$_2$), and with the signal that is received by the control circuit being amplified by a constant maximum signal gain factor (k$_{max}$) in a third transmission range (III) for a large phase difference that is greater than the second threshold value (PD$_2$), so that the output signal assumes the maximum value out$_{max}$.

15. A signal processor for carrying out the method as claimed in claim 13.

16. The signal processor as claimed in claim 15, wherein the signal processor is a digital signal processor (DSP).

17. A PLL circuit for eliminating self-jitter in a signal received by a control circuit, having
    a phase comparison circuit for producing a phase difference signal that indicates the phase difference between the received signal and a fed-back output signal from the PLL circuit;
    a loop filter for filtering the phase difference signal produced by the phase comparison circuit;
    an oscillator, which is controlled by the filtered phase difference signal, for producing the output signal from the PLL circuit; and
    a point-symmetrical transfer function;
    wherein the nonlinear transfer function of the loop filter has three transmission ranges (I, II, III), with the loop filter in a first transmission range (I) having a signal gain of zero for a small phase difference up to a first threshold value (PD$_1$), with the loop filter having a nonlinear signal gain in a second transmission range (II) for a medium phase difference between the first threshold value (PD$_1$) and a second threshold value (PD$_2$), and with the loop filter having a constant maximum signal amplitude in a third transmission range (III) for a large phase difference, which is greater than the second threshold value (PD$_2$).

18. A PLL circuit for eliminating self-jitter in a signal received by a control circuit, having:
    a phase comparison circuit for producing a phase difference signal that indicates the phase difference between the received signal and a fed-back output signal from the PLL circuit;
    a digital loop filter for filtering the phase difference signal produced by the phase comparison circuit;
    an oscillator, which is controlled by the filtered phase difference signal, for producing the output signal from the PLL circuit;
    wherein the loop filter has a nonlinear transfer function that has three transmission ranges (I, II, III), with the loop filter in a first transmission range (I) having a signal gain of zero for a small phase difference up to a first threshold value (PD$_1$), with the loop filter having a nonlinear signal gain in a second transmission range (II) for a medium phase difference between the first threshold value (PD$_1$) and a second threshold value (PD$_2$), and with the loop filter having a constant maximum signal amplitude in a third transmission range (III) for a large phase difference, which is greater than the second threshold value (PD$_2$);
    wherein the digital loop filter has a memory for storing signal gain coefficients (K$_i$) and has a multiplexer which is controlled by the phase difference signal and passes on the stored signal gain coefficients, as a function of the phase difference signal, to a multiplier, which multiplies the phase difference signal by the signal gain coefficients (K$_i$) that are passed on.

19. The PLL circuit as claimed in claim 18, wherein memory is programmable.

20. A PLL circuit for eliminating self-jitter in a signal received by a control circuit, having
    a phase comparison circuit for producing a phase difference signal that indicates the phase difference between the received signal and a fed-back output signal from the PLL circuit;
    a digital loop filter for filtering the phase difference signal produced by the phase comparison circuit;
    an oscillator, which is controlled by the filtered phase difference signal, for producing the output signal from the PLL circuit;
    wherein the loop filter has a nonlinear transfer function that has three transmission ranges (I, II, III), with the loop, filter in a first transmission range (I) having a signal gain of zero for a small phase difference up to a first threshold value (PD$_1$), with the loop filter having a nonlinear signal gain in a second transmission range (II) for a medium phase difference between the first threshold value (PD$_1$) and a second threshold value (PD$_2$), and with the loop filter having a constant maximum signal amplitude in a third transmission range (III) for a large phase difference, which is greater than the second threshold value (PD$_2$); and
    wherein the digital loop filter has a memory for storing output values (out$_i$) from the digital loop filter and has a multiplexer that is controlled by the phase difference signal and passes on the stored output values as a function of the phase difference signal.

21. The PLL circuit as claimed in claim 20, wherein the memory is programmable.

* * * * *